United States Patent
Yang et al.

(10) Patent No.: US 11,744,140 B2
(45) Date of Patent: Aug. 29, 2023

(54) FLEXIBLE DISPLAY PANEL AND FABRICATION METHOD THEREOF

(71) Applicant: BOE TECHNOLOGY GROUP CO., LTD., Beijing (CN)

(72) Inventors: Jing Yang, Beijing (CN); Fangxu Cao, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 529 days.

(21) Appl. No.: 16/977,207

(22) PCT Filed: Nov. 28, 2019

(86) PCT No.: PCT/CN2019/121617
§ 371 (c)(1),
(2) Date: Sep. 1, 2020

(87) PCT Pub. No.: WO2021/102801
PCT Pub. Date: Jun. 3, 2021

(65) Prior Publication Data
US 2022/0376177 A1    Nov. 24, 2022

(51) Int. Cl.
*H10K 71/80*    (2023.01)
*H10K 50/844*    (2023.01)
*H10K 59/122*    (2023.01)
*H10K 71/00*    (2023.01)
*H10K 77/10*    (2023.01)
*H10K 59/12*    (2023.01)
*H10K 102/00*    (2023.01)

(52) U.S. Cl.
CPC ........... *H10K 71/80* (2023.02); *H10K 50/844* (2023.02); *H10K 59/122* (2023.02); *H10K 71/00* (2023.02); *H10K 77/111* (2023.02); *H10K 59/1201* (2023.02); *H10K 2102/311* (2023.02)

(58) Field of Classification Search
None
See application file for complete search history.

(56) References Cited

U.S. PATENT DOCUMENTS

2019/0280069 A1* 9/2019 Jung .................. H10K 59/121
2021/0151698 A1* 5/2021 Kim .................. H10K 50/844
2022/0013599 A1* 1/2022 Hong .................. H10K 59/88

* cited by examiner

*Primary Examiner* — J. E. Schoenholtz
(74) *Attorney, Agent, or Firm* — WHDA, LLP

(57) ABSTRACT

The present disclosure relates to a method of fabricating a display panel. The method may include: forming a separation layer having first openings on a surface of the substrate; forming a flexible substrate layer covering the separation layer and the first openings; forming a TFT layer having second openings on a surface of the flexible substrate layer opposite from the substrate; removing a part of the flexible substrate layer that is underneath the second openings; forming a PDL layer covering the TFT layer, side walls of the third openings, and a part of the separation layer in the third openings, thereby forming fourth openings having a fourth width larger than the first width; forming an encapsulation layer covering the PDL layer and the fourth openings; and separating the flexible substrate layer from the substrate.

20 Claims, 5 Drawing Sheets

FLEXIBLE DISPLAY PANEL AND FABRICATION METHOD THEREOF

TECHNICAL FIELD

The present disclosure relates to display technologies, and in particular, to a flexible display panel, a method of fabricating a flexible display panel, and a display apparatus.

BACKGROUND

A flexible display device is a display device formed on a flexible substrate. Recently, stretchable flexible screens have attracted wide attention due to wide viewing angle, easy to carry, and their ability to be curled, especially for use in biomedicine and wearable applications.

Generally, the stretchable display devices are fabricated using a flexible layer with an island-bridge configuration to enhance the stretchability of functional devices. In the island-bridge configuration, thin film transistors and electroluminescent devices are fabricated in the islands. The devices are interconnected by interconnections or flexible bridges. These stretchable interconnections can be prepared by utilizing highly malleable/compliant electronic materials, such as low-temperature liquid metals, or by designing the interconnections so as to mitigate local strains through out-of-plane deformations. Openings in the flexible substrate can accommodate large and reversible deformation for strains applied on the stretchable display devices.

BRIEF SUMMARY

One embodiment of the present disclosure is a method of fabricating a display panel. The method may include: providing a substrate; forming a separation layer having first openings on a surface of the substrate, wherein the first openings have a first width and a first thickness; forming a flexible substrate layer covering the separation layer and the first openings; forming a TFT layer having second openings on a surface of the flexible substrate layer opposite from the substrate, wherein the second openings are above the first openings and have a second width larger than the first width; removing a part of the flexible substrate layer that is underneath the second openings, thereby forming third openings having a third width in the TFT layer and the flexible substrate layer; forming a PDL layer covering the TFT layer, side walls of the third openings, and a part of the separation layer in the third openings, thereby forming fourth openings having a fourth width in the PDL layer larger than the first width; forming an encapsulation layer covering the PDL layer and the fourth openings; separating the flexible substrate layer from the substrate.

Optionally, forming the separation layer having the first openings on the surface of the substrate may include forming a metal layer having the first thickness on the surface of the substrate, and annealing the metal layer to form a metal oxide layer on a surface of the metal layer opposite from the substrate.

Optionally, before annealing the metal, the method may further include patterning the metal layer to form the first openings having the first width.

Optionally, after annealing the metal layer, the method may further include patterning the metal oxide layer to form the first openings having the first width.

Optionally, an orthographic projection of each of the fourth openings on the substrate may cover an orthographic projection of each of the first openings on the substrate.

Optionally, a center of the orthographic projection of each of the fourth openings on the substrate substantially may coincide with a center of the orthographic projection of each of the first openings on the substrate.

Optionally, after forming the PDL layer and before separating the flexible substrate layer from the substrate, the method may further include forming an EL material layer on the TFT layer.

Optionally, separating the flexible substrate layer from the substrate may be performed by a mechanical force.

Optionally, the method may further include adhering a stretchable film to a surface of the flexible substrate layer opposite from the TFT layer.

Optionally, the first width of each of the first openings may be in a range of 1 μm to 5 μm and at least three times smaller than the third width of each of the third openings.

Optionally, the first thickness of each of the first openings may be in a range of 100 Å to 600 Å.

Optionally, the first width of each of the first openings may be smaller than the second width of each of the second openings and the third width of each of the third openings.

Optionally, removing the part of the flexible substrate layer that is underneath the second openings, thereby forming third openings having a third width in the TFT layer and the flexible substrate layer may include patterning, developing, and etching processes.

Optionally, the separation layer is made of Mo or W.

Optionally, the flexible substrate layer may include polyimide.

Optionally, the substrate may be a glass substrate.

Optionally, the encapsulation layer may include a first inorganic layer, an organic layer, and a second inorganic layer in this order.

Optionally, the first inorganic layer may include $SiON_9$, and the second inorganic layer may include $SiN_x$.

Another embodiment of the present disclosure is a display panel formed by the method described above.

Another embodiment of the present disclosure is a display apparatus including the display panel.

BRIEF DESCRIPTION OF THE DRAWINGS

The drawings are intended to provide a further understanding of the technical solutions of the present disclosure, and are intended to be a part of the specification, and are used to explain the technical solutions of the present disclosure, and do not constitute a limitation of the technical solutions of the present disclosure.

DETAILED DESCRIPTION

Figure 1:
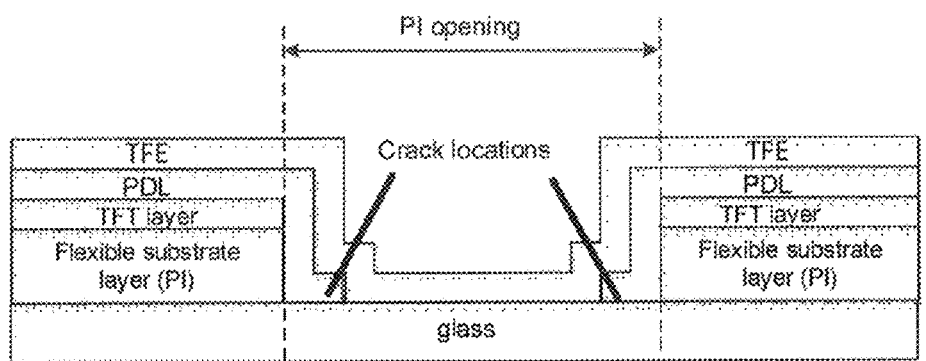
FIG. 1 is a graph illustrating a method of fabricating a stretchable flexible display panel in the related art.

The present disclosure will be described in further detail with reference to the accompanying drawings and embodiments in order to provide a better understanding of the technical solutions of the present disclosure for those skilled in the art. Throughout the description of the disclosure, reference is made to FIGS. 1-6. When referring to the figures, like structures and elements shown throughout are indicated with like reference numerals.

In the description of the following embodiments, specific features, structures, materials or characteristics may be combined in any suitable manner in any one or more embodiments or examples.

FIG. 1 shows a graph illustrating a method of fabricating a stretchable flexible display panel in the related art. The stretchable flexible display panel is usually fabricated by employing a flexible substrate layer having an island-bridge structure to further enhance the stretchability of the display panel. Thin film transistors (TFT) and electroluminescent (EL) devices are fabricated on the islands of the flexible substrate layer. In the island-bridge configuration, islands are separated by holes, trenches or openings and can be connected by interconnections or flexible bridges to alleviate strains applied on the flexible substrate layer. Accordingly, the stretchable flexible display panel can tolerate substantial and reversible deformation.

The flexible substrate layer having the island-bridge configuration can be prepared by utilizing highly malleable/compliant electronic materials, such as low-temperature liquid metals, and the interconnections or bridges can be designed in different shapes or configurations to mitigate local strains, for example, through out-of-plane deformations.

Figure 2:
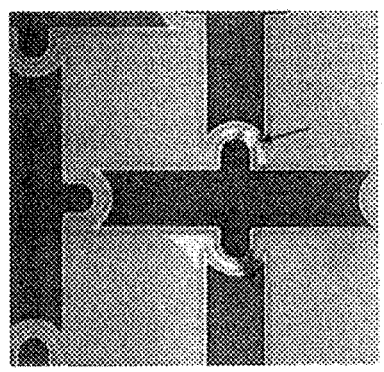
FIG. 2 is a top view of a part of a stretchable flexible display panel in the related art.

As shown in FIG. 1, the flexible substrate layer is typically made of polyimide (PI) and first fabricated on a rigid substrate such as a glass substrate. After subsequent fabrication processes, a thin film encapsulation (TFE) layer may be used to encapsulate the fabricated elements and prevent air and moisture from penetrating into the stretchable flexible display panel. Then, a laser lift off (LLO) process may be performed to peel the flexible substrate layer off from the rigid substrate. Then, a stretchable substrate may be adhered to a surface of the flexible substrate layer opposite from the TFE layer. However, as shown in FIG. 2, because of the direct contact between the flexible substrate layer and the rigid substrate, a large peeling force may be needed to peel off the flexible substrate layer from the rigid substrate, and such large peeling force may lead to large area cracks around the bridges and the edges of the flexible substrate layer, as indicated by an arrow in FIG. 2, thereby affecting the reliability and lifespan of the display panel. Furthermore, because it is more likely that the cracks occur at the edges of the islands of the flexible substrate layer, as shown by solid lines in FIG. 1, the side surfaces of the flexible substrate layer may be easily exposed. As such, moisture and air, etc. can penetrate into the flexible display panel through the cracks at the edges of the islands of the flexible substrate layer, thereby further reducing the reliability and lifespan of the flexible display panel.

One embodiment of the present disclosure provides a method of fabricating a stretchable flexible display panel. The method includes the following steps S10 to S70.

Figure 3:
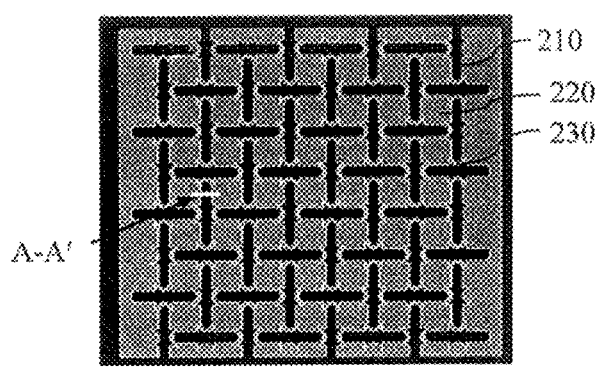
FIG. 3 is a top view of a pattern of a flexible substrate layer on a substrate according to one embodiment of the present disclosure.

In one embodiment, step S10 includes providing a substrate 500 and forming a separation layer 510 having first openings 515 on a surface of the substrate 500. Each of the first openings may have a first width and a first thickness. FIG. 3 shows a top view of the separation layer on the substrate according to one embodiment of the present disclosure. As shown in FIG. 3, the first openings 210 are a plurality of trenches having an oblong shape. The oblong shape has two long opposite sides parallel to each other, and the two opposite short sides each have an arc shape. The plurality of oblong trenches are arranged to form a plurality of islands 220 connected by a plurality of bridges 230, thereby forming an island-bridge configuration. As shown in FIG. 3, in one embodiment, because the two short sides of the oblong shaped trench each have an arc shape, one side of the bridge 230 may have a curved, concave shape to achieve more tolerance towards strains induced by bending, folding, and stretching.

The method of fabricating a stretchable flexible display panel according to some embodiments of the present disclosure will be described in further detail with reference to FIGS. 6A to 6E. FIGS. 6A to 6E are cross sectional views of FIGS. 3-5 along the line A-A' illustrating a method of fabricating a stretchable flexible display panel according to one embodiment of the present disclosure.

In one embodiment, forming the separation layer having the first openings on the surface of the substrate includes forming a metal layer having the first thickness on the surface of the substrate and annealing the metal layer to form a metal oxide layer on a surface of the metal layer opposite from the substrate.

In one embodiment, forming the separation layer having the first openings on the surface of the substrate further includes, before annealing the metal layer, patterning the metal layer to form the first openings having the first width. In one embodiment, forming the separation layer having the first openings on the surface of the substrate further includes, after annealing the metal layer, patterning the metal layer to form the first openings having the first width.

Figure 6A:
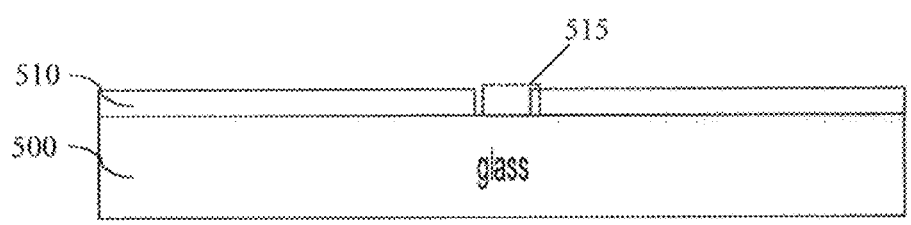
FIGS. 6A-6F are cross sectional views of FIGS. 3-5 along the line A-A' illustrating a method of fabricating a stretchable flexible display panel according to one embodiment of the present disclosure.

As shown in FIG. 6A, the substrate 500 may be a rigid substrate such as a glass substrate or the like. The separation layer 510 may be formed on a surface of the substrate 500 by techniques such as vacuum deposition, chemical vapor deposition, or sputtering.

The separation layer 510 may be a metal layer, and made of Mo or W. The thickness of the metal layer may be approximately in a range of 100 Å to 600 Å. In one embodiment, a heat treatment or an annealing process, for example, at a high temperature of about 350° C. in an air atmosphere or an oxygen environment is applied to the metal layer. As such, a metal oxide layer such as a molybdenum oxide layer or a tungsten oxide layer is formed on the surface of the metal layer opposite from the substrate in the heating or annealing process.

In one embodiment, the patterning process such as a photolithography technique is performed on the metal layer to produce the separation layer having the first openings, as shown in FIG. 6A. The size such as the width and the thickness of the first openings and the shape of the first openings may vary based on the stretching requirement. The patterning process may include steps of applying a layer of photoresist on the metal layer, patterning the layer of photoresist, and etching the underlying metal layer using the patterned layer of photoresist as a mask.

Figure 4:
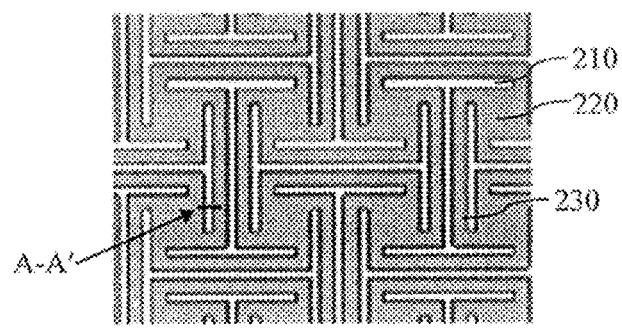
FIG. 4 is an enlarged top view of a pattern of a flexible substrate layer on a substrate according to one embodiment of the present disclosure.

FIG. 4 shows an enlarged top view of a pattern of a flexible substrate layer on a substrate according to one embodiment of the present disclosure. As shown in FIG. 4, some of the first openings 210 may form an H shape to better isolate the islands 220 for desired flexibility. The islands 220 are connected through bridges 230 having straight lines. A recurring pattern of the islands is formed by the arrangement of the H-shaped first openings, as shown in FIG. 4.

Figure 5:
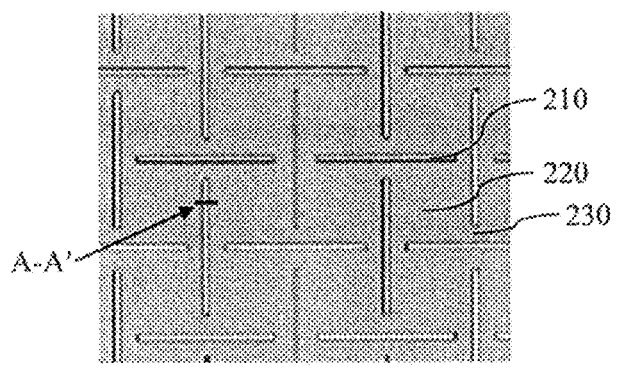
FIG. 5 is an enlarged top view of a pattern of a flexible substrate layer on a substrate according to one embodiment of the present disclosure.

FIG. 5 shows an enlarged top view of a pattern of a flexible substrate layer on a substrate according to one embodiment of the present disclosure. The first openings 210 are straight oblong shapes separated from one another. The width of the first openings is small so that the bridges 230 are short in this island-bridge configuration. The arrangement of the openings also forms a recurring pattern of islands, as shown in FIG. 5. The "width" of the first opening herein refers to the width of the oblong shape in a direction perpendicular to the long sides of the oblong shape, for example, along the line A-A' in FIGS. 3-5. The size such as the width of the first openings and the shape of the first openings may vary based on the stretching requirement. The width of the first openings may be approximately in a range of 1 μm to 5 μm.

Figure 6B:
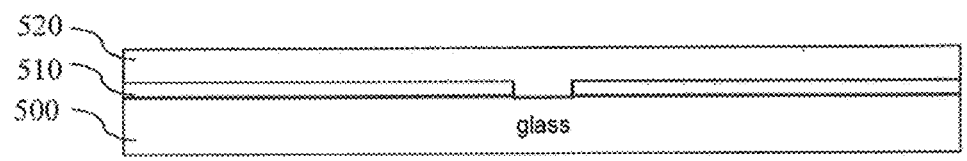

In one embodiment, as shown in FIG. 6B, step S20 includes forming a flexible substrate layer 520 covering the separation layer and the first openings. The flexible substrate layer 520 covers the separation layer 510 and fills the first openings 515. The flexible substrate layer may be made of a polymer such as polyimide. The thickness of the flexible substrate layer may be approximately in a range of 5 μm to 25 μm. In one embodiment, first, a polymer solution such as a polyimide solution may be used to coat the separation layer. Then, steps such as heat drying in vacuum (HVCD) and baking in an oven are used to cure the coated layer of polymer solution to form the flexible substrate layer on the substrate.

Figure 6C:
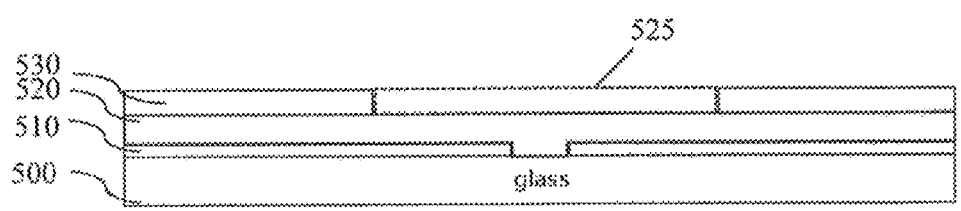

In one embodiment, as shown in FIG. 6C, step S30 includes forming a thin film transistor (TFT) layer 530 having second openings 525 on a surface of the flexible substrate layer 520 opposite from the substrate. The second openings may be above the first openings and have a second width, which is larger than the first width of the first openings. The TFT layer may include a thin film transistor array, which includes a plurality of thin film transistors separated from one another. Forming the TFT layer may include formation of a planarization (PLN) layer on the thin film transistor array so that the TFT layer has a flat surface on the side opposite from the substrate. As shown in FIG. 6C, the TFT layer has second openings above the first openings. A second width of the second opening is larger than the first width of the first opening. An orthographic projection of the second opening on the substrate may cover an orthographic projection of the first opening on the substrate. In one embodiment, a central axis of each of the second openings may coincide or substantially coincide with a central axis of one of the first openings. That is, a center of the orthographic projection of the second opening on the substrate may coincide or substantially coincide with a center of the orthographic projection of the first opening on the substrate.

Figure 6D:
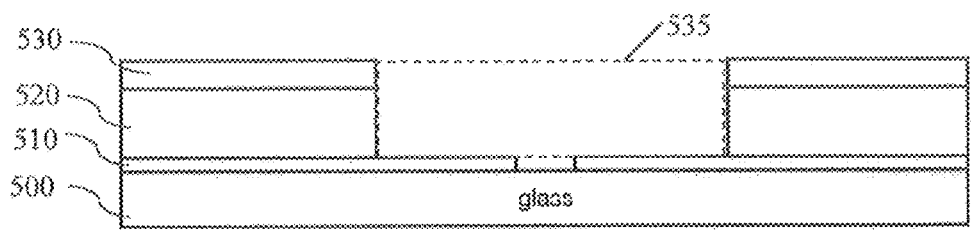

In one embodiment, as shown in FIG. 6D, step S40 includes removing a part of the flexible substrate layer 520 that is underneath the second openings 525, thereby forming third openings 535 having a third width in the TFT layer 530 and the flexible substrate layer 520. In general, the width of the third openings may be approximately in a range of 5 μm to 15 μm. In some situation, the width of the third openings may be increased up to 200 μm but large openings may sacrifice display resolution due to the increased separation between the islands. In one embodiment, patterning, developing, and etching processes may be performed on the flexible substrate layer to remove the part of the flexible substrate that is underneath the second openings. As such, a plurality of third openings is formed in the flexible substrate layer and the TFT layer. Each of the third openings has a third width. The third width of the third opening is larger than the first width of the first opening. An orthographic projection of the third opening on the substrate may cover an orthographic projection of the first opening on the substrate. The third opening may include the previous second opening, and has the same width as the second opening, as shown in FIG. 6D. The sidewalls of the third openings may include side surfaces of the TFT layer and the flexible substrate layer. The bottom surface of the third opening may include the separation layer and the first opening exposing the underlying substrate. In one embodiment, a central axis of each of the third openings coincides or substantially coincides with a central axis of one of the first openings. That is, a center of the orthographic projection of the third opening on the substrate may coincide or substantially coincide with a center of the orthographic projection the first opening on the substrate.

Figure 6E:
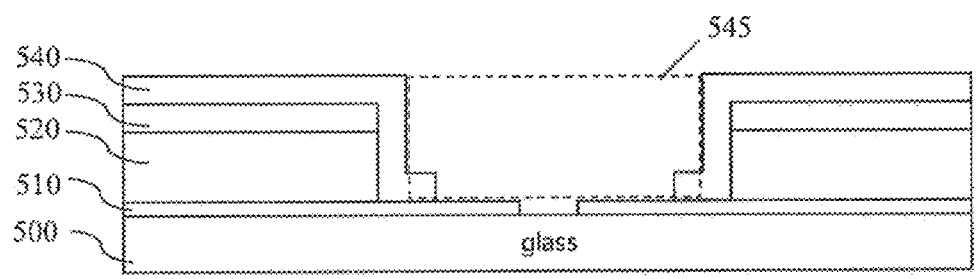

In one embodiment, as shown in FIG. 6E, step S50 includes forming a pixel defining layer (PDL) layer 540 on the TFT layer. The PDL layer defines a plurality of pixel wells on the TFT layer. The PDL layer also covers sidewalls of the third openings, that is, the side surfaces of the TFT layer and the flexible substrate layer, and a part of the separation layer at the bottom of the third openings, thereby forming fourth openings 545 having a fourth width. As such, sidewalls of the fourth opening are covered by the PDL layer, and the bottom surface of each of the fourth openings includes a part of the PDL layer, a part of the separation layer, and the first opening exposing the underlying substrate. Each of the fourth openings has a fourth width larger than the first width of the first opening, but smaller than the third width of the third opening because the sidewalls of the third openings are covered by the PDL layer. An orthographic projection of each of the fourth openings on the substrate covers an orthographic projection of one of the first openings on the substrate. The thickness of the PDL layer may be in a range of 1 μm to 5 μm. The width of the fourth openings may be in a range of 2 μm to 13 μm. In one embodiment, a central axis of the fourth opening coincides or substantially coincides with a central axis of the first opening. A center, of the orthographic projection of the fourth opening on the substrate coincides or substantially coincides with a center of the orthographic projection of the first opening on the substrate.

Figure 6F:
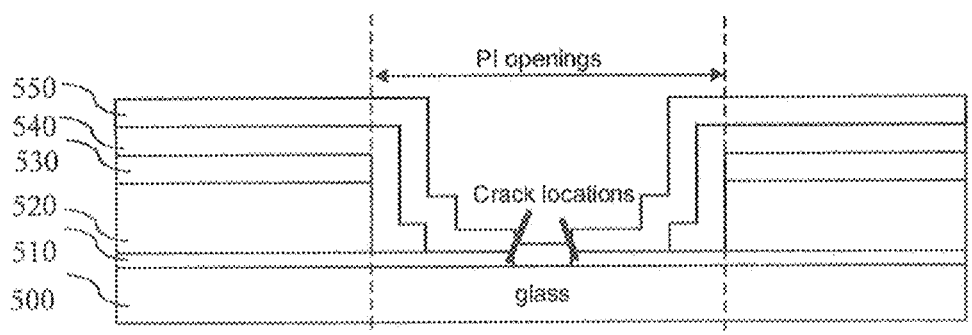

In one embodiment, as shown in FIG. 6F, step S60 includes forming an encapsulation layer 550 covering the PDL layer and the fourth openings. The encapsulation layer may protect the flexible display panel from external environments such as moisture and air. The encapsulation layer may have a substantially uniform thickness. In one embodiment, the encapsulation layer employs a thin film encapsulation (TFE) layer, which includes a first inorganic layer, an organic layer, and a second inorganic layer in this order. The first inorganic layer may include $SiON_9$ and have a thickness in a range of about 8000 Å to about 12000 Å. The thickness of the organic layer may be approximately in a range of about 8 μm to about 10 μm. The second inorganic layer may include $SiN_x$ and have a thickness in a range of about 4000 Å to about 9000 Å. The TFE layer covers the side surfaces and the bottom surface of the fourth openings. Thus, the TFE layer covers the part of the PDL layer and the part of the separation layer at the bottom surfaces of the fourth openings. Furthermore, the TFE layer fills into the first openings and is in direct contact with the underlying substrate in the first openings. As shown in FIG. 6F, openings between the islands may be referred to as PI openings. The width of the PI openings is equal to the width of the third openings. Because the second openings are formed in the TFT layer that is fabricated on the flexible substrate layer, the width of the second openings in the TFT layer may be equal to or less than the width of the third openings in the flexible substrate layer.

In one embodiment, after forming the PDL layer and before separating the flexible substrate layer from the substrate, the method further includes forming an electroluminescent (EL) layer in the plurality of pixel wells on the TFT layer. The EL layer may include at least one of an cathode layer, a hole injection layer, a hole transport layer, a light emission layer, an electron injection layer, an electron transport layer, an anode layer, or a combination thereof In one embodiment, step S70 includes separating the flexible substrate layer from the substrate. In one embodiment, a mechanical force is applied to separate the flexible substrate layer from the substrate. A laser lift off (LLO) process may be used in step S70 to peel the flexible substrate layer off from the substrate.

According to some embodiments of the present disclosure, since there is a separation layer between the flexible substrate layer and the substrate, the mechanical force required to peel the flexible substrate layer off from the substrate is significantly reduced comparing to that in the related art. Furthermore, since the first width of the first opening is much smaller than the third width of the third opening, the contact area of the encapsulation layer with the substrate is significantly reduced. Therefore, if there are any cracks during the peeling, it is more likely that the cracks occur at the edges of the first openings in the TFE layer, as illustrated by solid lines in FIG. 6F. Since the first width of the first opening is much smaller than the fourth width of the fourth opening, any cracks occurred are farther away from the flexible substrate layer. Thus, the side surface of the flexible substrate layer is still fully covered and protected by the TFE layer. As such, no air or moisture can penetrate into the flexible display panel through the cracks, thereby improving the reliability and the lifespan of the display panel.

In one embodiment, after separating the flexible substrate layer from the substrate, the method of forming the display panel may further include adhering a stretchable film to a surface of the flexible substrate layer opposite from the TFT layer.

In one embodiment, before adhering the stretchable film, a temporary protective film (TPF) may be formed on a surface of the encapsulation layer opposite from the substrate as a protective layer to protect the encapsulation layer during the separation of the flexible substrate layer from the substrate.

After the adhesion of the stretchable film, the temporary protective film may be removed, and subsequent processes of forming a touch layer, a polarizer layer, and a cover glass may be followed to complete the fabrication of the stretchable flexible display panel.

Some embodiments of the present disclosure provide a method of fabricating a stretchable flexible display panel. A separation layer having first openings is formed between the flexible substrate layer and the substrate, and an encapsulation layer having fourth openings is employed to protect the stretchable flexible display panel. The width of the first opening of the separation layer is much smaller than the width of the fourth opening of the flexible substrate layer, so that any cracks during the separation of the flexible substrate layer from the underlying substrate occurs in the encapsulation layer instead of the flexible substrate layer, thereby reducing the trace disconnection caused by the cracks. At the same time, the cracks are farther away from the side surfaces of the flexible substrate layer. Thus, the encapsulation layer still effectively protects the display panel from air or moisture from penetrating into the display panel through the cracks, thereby improving the reliability and lifespan of the display panel.

Another embodiment of the present disclosure further provides a display panel fabricated by the method according to one embodiment of the present disclosure. The stretchable flexible display panel may include a stretchable substrate, a flexible substrate layer 520, a TFT layer 530, a PDL layer 540, and an encapsulation layer 550 on the stretchable substrate in this order.

Another embodiment of the present disclosure further provides a display apparatus including the display panel according to one embodiment of the present disclosure.

Compared with the existing technique, the beneficial effects of the display apparatus provided in some embodiments of the present disclosure are the same as those of the display panel described above and are not repeated herein.

In one embodiment, the display apparatus may be any product or component having a display function, such as a mobile phone, a tablet computer, a television, a display, a notebook computer, a digital photo frame, or a navigator.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A method of fabricating a display panel, comprising:
providing a substrate;
forming a separation layer having first openings on a surface e substrate, wherein the first openings have a first width and a first thickness;
forming a flexible substrate layer covering the separation layer and the first openings;
forming a thin film transistor layer having second openings on a surface of the flexible substrate layer opposite from the substrate, wherein the second openings are above the first openings and have a second width larger than the first width;

removing a part of the flexible substrate layer that is underneath the second openings, thereby forming third openings having a third width in the thin film transistor layer and the flexible substrate layer;

forming a pixel defining layer covering the thin film transistor layer, sidewalls of the third openings, and a part of the separation layer in the third openings, thereby forming fourth openings having a fourth width larger than the first width;

forming an encapsulation layer covering the pixel defining layer and the fourth openings; and separating the flexible substrate layer from the substrate.

2. The method according to claim 1, wherein forming the separation layer having the first openings on the surface of the substrate comprises:

forming a metal layer having the first thickness on the surface of the substrate; and annealing the metal layer to form a metal oxide layer on a surface of the metal layer opposite from the substrate.

3. The method according to claim 2, before annealing, the metal layer, further comprising patterning the metal layer to form the first openings having the first width.

4. The method according to claim 2, after annealing the metal layer, further comprising patterning the metal oxide layer to form the first openings having the first width.

5. The method according to claim 1, wherein an orthographic projection of each of the fourth openings on the substrate covers an orthographic projection of one of the first openings on the substrate.

6. The method according to claim 5, wherein a center of the orthographic projection of each of the fourth openings on the substrate substantially coincides with a center of the orthographic projection of one of the first openings on the substrate.

7. The method according to claim 1, after forming the pixel defining layer and before separating the flexible substrate layer from the substrate, further comprising forming an electroluminescent material layer on the thin film transistor layer.

8. The method according to claim 1, wherein separating the flexible substrate layer from the substrate is performed by a mechanical force.

9. The method according to claim 1, further comprising:

adhering a stretchable film to a surface of the flexible substrate layer opposite from the thin film transistor layer.

10. The method according to claim 1, wherein the first width of each of the first openings is in a range of 1 µm to 5 µm and at least three times smaller than the third width of each of the third openings.

11. The method according to claim 1, wherein the first thickness of each of the first openings is in a range of 100 Å to 600 Å.

12. The method according to claim 1, wherein the first width of each of the first openings is smaller than the second width of each of the second openings and the third width of each of the third openings.

13. The method according to claim 1, removing the part of the flexible substrate layer that is underneath the second openings, thereby forming third openings having a third width in the thin film transistor layer and the flexible substrate layer comprises patterning, developing, and etching processes.

14. The method according to claim 1, Wherein the separation layer is made of Mo or W.

15. The method according to claim 1, wherein the flexible substrate layer comprises polyimide.

16. The method according to claim 1, wherein the substrate is a glass substrate.

17. The method according to claim 1, wherein the encapsulation layer comprises a first inorganic layer, an organic layer, and a second inorganic layer in this order.

18. The method according to claim 1, wherein the first inorganic layer comprises $SiON_9$, and the second inorganic layer comprises $SiN_x$.

19. A display panel formed by the method of claim 1.

20. A display apparatus comprising the display panel of claim 19.

* * * * *